(12) United States Patent
Oh et al.

(10) Patent No.: US 12,044,915 B2
(45) Date of Patent: Jul. 23, 2024

(54) IMPRINTED EMBOSS IN CHIP-ON-FILM

(71) Applicant: Dell Products L.P., Round Rock, TX (US)

(72) Inventors: Guentaek Oh, Singapore (SG); BongJun Lee, Cascadia (SG)

(73) Assignee: Dell Products L.P., Round Rock, TX (US)

( * ) Notice: Subject to any disclaimer, the term of this patent is extended or adjusted under 35 U.S.C. 154(b) by 336 days.

(21) Appl. No.: 17/024,058

(22) Filed: Sep. 17, 2020

(65) Prior Publication Data
US 2022/0087038 A1   Mar. 17, 2022

(51) Int. Cl.
| | |
|---|---|
| G02F 1/1333 | (2006.01) |
| G02F 1/13357 | (2006.01) |
| G02F 1/1345 | (2006.01) |
| B26F 1/40 | (2006.01) |
| H01L 23/31 | (2006.01) |
| H05K 1/18 | (2006.01) |
| H05K 3/00 | (2006.01) |
| H05K 5/00 | (2006.01) |

(52) U.S. Cl.
CPC .. *G02F 1/133308* (2013.01); *G02F 1/133608* (2013.01); *G02F 1/1345* (2013.01); *G02F 1/13452* (2013.01); *B26F 1/40* (2013.01); *H01L 23/3114* (2013.01); *H05K 1/189* (2013.01); *H05K 3/0044* (2013.01); *H05K 5/0017* (2013.01); *H05K 5/0043* (2013.01)

(58) Field of Classification Search
CPC ... G02F 1/1345; G02F 1/13452–13458; G02F 1/133308; G02F 1/133608
See application file for complete search history.

(56) References Cited

U.S. PATENT DOCUMENTS

| | | | | |
|---|---|---|---|---|
| 2011/0120770 A1* | 5/2011 | Yokonuma | ........... | H05K 1/0215 |
| | | | | 174/94 S |
| 2016/0186944 A1* | 6/2016 | Park | .................. | G02F 1/133308 |
| | | | | 362/97.1 |

FOREIGN PATENT DOCUMENTS

JP         P2005-55512 A    *   3/2005

* cited by examiner

*Primary Examiner* — Dung T Nguyen
(74) *Attorney, Agent, or Firm* — Norton Rose Fulbright US LLP

(57) ABSTRACT

An information handling system display may include a display panel cell, a mold frame, and a chip-on-film. The chip-on-film may be coupled to the display panel cell. The chip-on-film may include one or more protrusions. A first portion of the chip-on-film may be adjacent to the one or more protrusions across a width of a first surface of the chip-on-film. The one or more protrusions may be in contact with a mold frame of the display. The first portion of the chip-on-film adjacent to the one or more protrusions may not be in contact with the mold frame of the display.

12 Claims, 8 Drawing Sheets

IMPRINTED EMBOSS IN CHIP-ON-FILM

FIELD OF THE DISCLOSURE

The present disclosure generally relates to information handling systems, and more particularly relates to imprinted emboss of chips on film for displays of information handling systems.

BACKGROUND

As the value and use of information continue to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

Many information handling systems include displays to allow users to view and manipulate information. In some cases, displays may exhibit lines of dead or discolored pixels. Information handling system displays may come in a variety of shapes and sizes. An example display 100, with a line 102 of malfunctioning pixels, is shown in FIG. 1. A line 102 of malfunctioning pixels may span the entire vertical height of the display. In some cases, users may experience multiple lines of discolored or dead pixels. Such visual defects may negatively impact a user experience, reducing the aesthetic appeal of a display and making it more difficult for a user to view and manipulate information using the display. Such defects can also increase manufacturer costs, requiring costly repairs and/or replacements.

Shortcomings mentioned here are only representative and are included simply to highlight that a need exists for improved information handling systems. Embodiments described herein address certain shortcomings but not necessarily each and every one described here or known in the art. Furthermore, embodiments described herein may present other benefits than, and be used in other applications than, those of the shortcomings described above.

SUMMARY

A display of an information handling system may be designed to reduce the occurrence of display abnormalities by adjusting a form of a chip-on-film (COF) connecting a printed circuit board (PCB) of the display to a display panel cell of the display. For example, a COF of a display may include one or more protrusions, such as embossed protrusions, arranged to maintain distance between at least a portion of the COF and a mold frame of the display, preventing particles, such as food, dust, and other detritus, from becoming trapped between the COF and the mold frame. Particles, when trapped between a COF and a mold frame, may distort, dent, or otherwise deform the COF. Such deformation may cause abnormalities in the display, such as dead or discolored lines of pixels. Maintaining a distance between at least a portion of the COF and the adjacent mold frame of the display may reduce the occurrence of such display abnormalities. A reduction in display abnormalities may enhance a user experience and reduce repair and replacement costs.

An information handling system display may include a display panel cell, a mold frame, and a COF. The display panel cell may include pixels for displaying information to a user. The COF may couple the display panel cell to a display PCB to allow the PCB to control the display panel cell. For example, the display COF may include a plurality of traces for transmitting information from the display PCB to the display panel cell. The display COF may include a first connector for coupling to the PCB and a second connector for coupling to a display panel cell. The mold frame may physically support the display panel cell and/or the display PCB. The display may further include a backlight and a cover shield for the display panel cell.

The display COF may be formed such that only a portion of the display COF is in contact with the display mold. For example, a first portion of the COF may extend outward beyond a second portion of the COF, such as in a concave pattern. In some embodiments, the COF may include one or more protrusions. For example, protrusions may extend from one or more locations of the COF, such that a first surface of the COF includes protrusions and a corresponding opposite surface of the COF includes depressions. Thus, protrusions of the COF may be formed without depositing any additional layers of material on the COF. The protrusions may be in contact with the mold frame, while the rest of the COF, such as areas adjacent to the protrusions across a width of the first surface of the COF, may not be in contact with the mold frame. The second portion of the COF may, in some cases, be adjacent to the first portion of the chip-on-film across a width of a first surface of the COF. Thus, a portion of a COF which may otherwise be pressed against a corner of a mold frame may include one or more protrusions that may contact the mold frame and may raise a remaining portion of the COF away from the mold frame such that at least a portion of the COF that would otherwise be in contact with a mold frame is not in contact with the mold frame.

In some embodiments, the one or more protrusions of the COF may be a plurality of imprinted embossed impressions, such as a plurality of dome-shaped impressions. The plurality of imprinted embossed impressions may be convex embossed impressions, and apexes of one or more of the convex imprinted embossed impressions may be in contact with the mold frame. Depressions in the COF may be formed opposite the protrusions on an opposite surface of the COF as part of the process of forming the protrusions. In some embodiments, the imprinted embossed impressions may be formed in an asymmetrical pattern, such that they are positioned in a staggered formation across a surface of the COF. The protrusions may comprise less than one percent of a surface area of the COF. In some embodiments, protrusions may comprise less than one percent of a first area of the COF, such as an area of the COF that would otherwise be in contact with the mold frame. Minimizing surface area of the COF in contact with the mold frame may reduce the likelihood of particles becoming trapped between the portion of the COF that is in contact with the mold frame and the mold frame during assembly of the display.

In some embodiments, traces of the COF may be aligned to avoid distortion of the traces by protrusions. A display may further include a decorative casing, and at least a portion of a second surface of the chip-on-film, opposite the first surface of the chip having the protrusions, may be in contact with the decorative casing.

A method for embossing a COF may include printing a plurality of traces on the COF. The COF may then be passed through a plurality of rollers to emboss the COF with one or more impressions. In some embodiments, the traces may be printed on the COF after passing the COF through the plurality of rollers.

The plurality of rollers may include a first roller having one or more convex protrusions that extend from the first roller. The plurality of rollers may include a second roller having one or more concave depressions that extend into the second roller. The convex protrusions of the first roller may align with the concave depressions of the second roller such that when a COF is passed through the rollers the protrusions and depressions of the rollers may form one or more embossed impressions in the COF. The first and second rollers may, in some embodiments, be heated rollers. The one or more convex protrusions of the first roller and the one or more concave depressions of the second roller may be aligned to form asymmetrical embossed impressions in the chip-on-film. For example, the impressions may vary in size or may be staggered in positioning on the COF. In some embodiments, the plurality of traces on the COF may be aligned to avoid distortion of the traces by the plurality of rollers.

An information handling system may include a memory and a processor for performing the steps described herein. Instructions for performing the steps described herein may be stored on a non-transitory computer readable medium.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be used in this application. The teachings can also be used in other applications and with several different types of architectures.

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, a two-in-one laptop/tablet computer, mobile device (e.g., personal digital assistant (PDA), smart phone, tablet computer, or smart watch), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more virtual or physical buses operable to transmit communications between the various hardware and/or software components.

Figure 1:
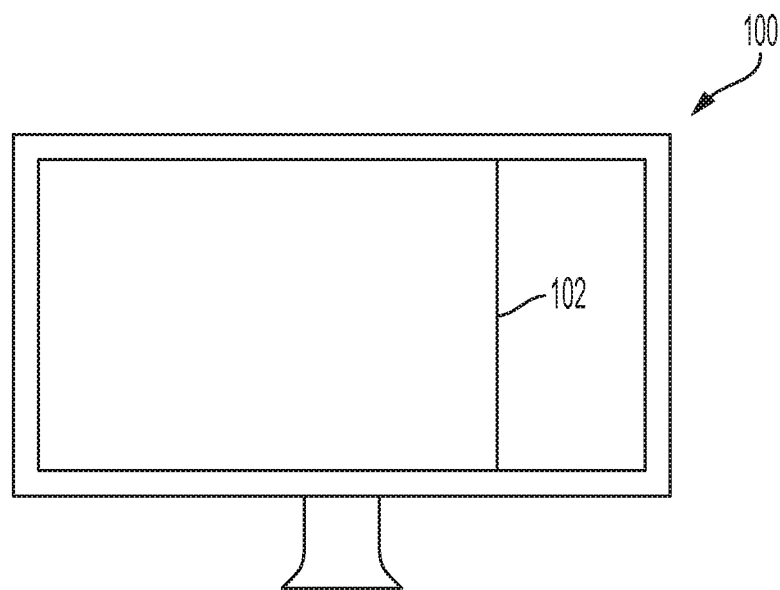
FIG. 1 is an illustration of a display of an information handling system having an abnormality, according to the prior art.
Figure 2A:
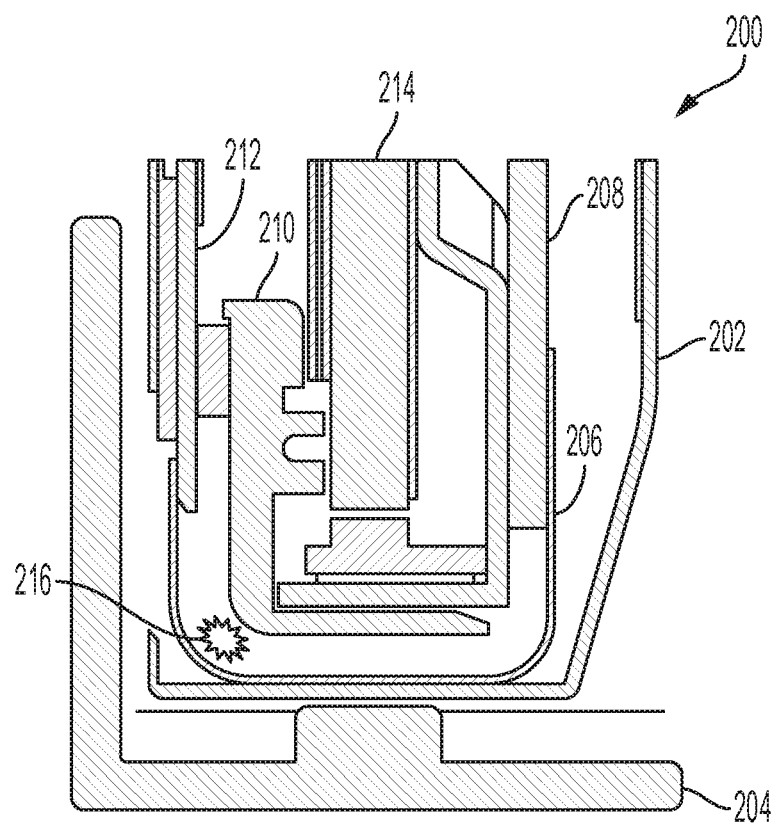
FIG. 2A is an illustration of a vertical cross section of an information handling system display according to some embodiments of the disclosure.

Information handling system displays may be manufactured in a variety of shapes and sizes. Displays may include display panel cells that may include anywhere from thousands to millions of pixels. An example vertical cross section 200 of an information handling system display is shown in FIG. 2A. A display may include a housing 202 which may be formed of metal, plastic, or another material and may support and house components of the display. The display may also include decorative casing 204 that may enhance the aesthetic appeal of the display and may further protect internal components of the display. A display panel cell 212 of the display may be connected to a display printed circuit board (PCB) 208. The display PCB 208 may control the display panel cell 212 to display information for a user. The display PCB 208 may be connected to the display panel cell 212 by a chip-on-film (COF) 206. In some embodiments, the COF 206 may include multiple traces for allowing the display PCB 208 to control multiple lines of pixels of the display panel cell 212. In some embodiments, multiple COFs may connect the display PCB 208 to the display panel cell 212. The display COF 206 may be made of a thin and flexible material. For example, the display COF 206 may include a flexible base film, one or more traces, such as copper traces, an integrated circuit (IC), and one or more solder resistors. The display may also include a backlight 214 for illuminating the display panel cell 212. A display mold frame 210 may physically support components of the display, such as the display panel cell 212 and the display PCB 208.

Figure 2B:
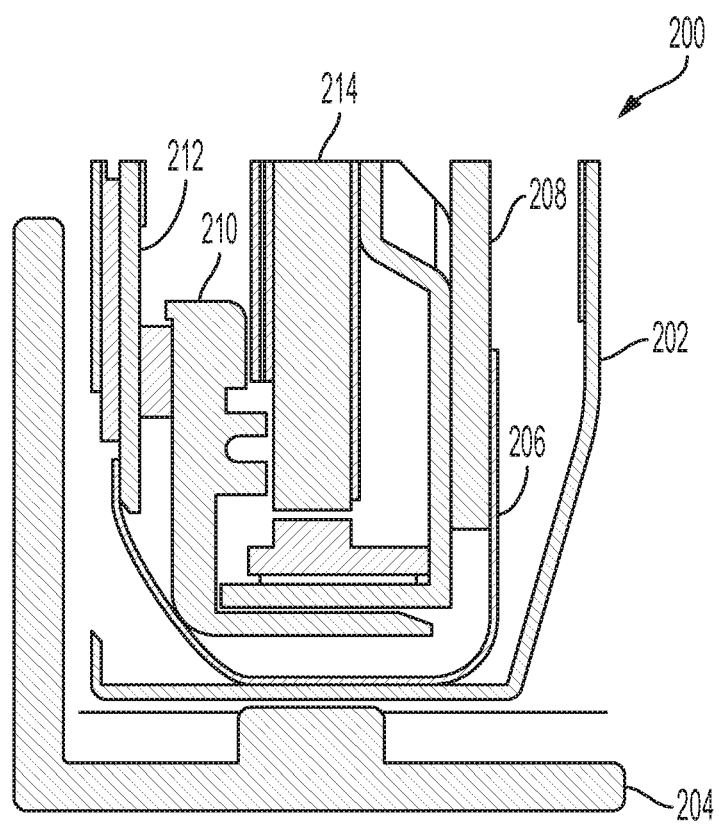
FIG. 2B is an illustration of a vertical cross section of an information handling system display according to some embodiments of the disclosure.

In some cases, particles, such as particle 216, may enter the display housing 202. For example, during manufacturing particles may be trapped inside the display. Alternatively or additionally, particles may enter the display during use. For example, in environments where frequent cleaning of the display is performed, or food and beverages are consumed around the display, food, dust, and cleaning agent particles may enter and may become trapped in the display. For example, particle capture in the display may be particularly prevalent in internet café and library environments. Particles may become trapped by the display COF 206 and may distort or damage the display COF 206. For example, in FIG. 2A a gap between display COF 206 and mold frame 210 is shown, with a particle 216 entering the gap. FIG. 2B shows a display in which the position of the display COF 206 has shifted and is in contact with a corner of the mold frame 210. The display COF 206 may shift when the display is adjusted, trapping particles between the display COF 206 and the mold frame 210. Furthermore, if insufficient distance is maintained between the display COF 206 and the mold frame 210, larger particles may become trapped due to a lack of sufficient space for the particles to pass between the display COF 206 and the mold frame 210 freely. Manufacturing specifications for displays may specify that a distance should be maintained between the display COF 206 and the mold frame 210. However, manufacturing tolerances may allow for situations in which the display COF 206 positioning has too little or too much variance, allowing the display COF 206 to be pressed against the mold frame 210. For example, some display designs use double sided tape for affixing the PCB to an internal component of the display, such as a backlight. The use of double-sided tape for affixing the PCB may introduce assembly gaps and tolerances, allowing for variance in positioning of the COF 206 against the mold frame 210. Thus, although design specifications may specify that a gap between the COF 206 and the mold frame 210 should be maintained, the gap may not always be maintained.

Figure 3:
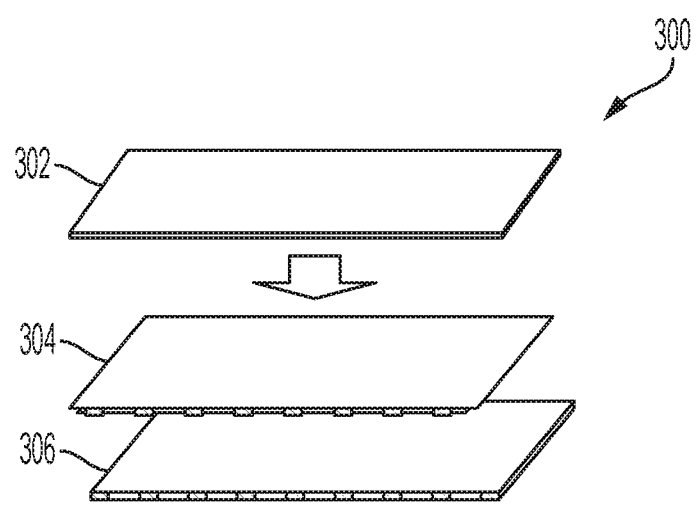
FIG. 3 is an illustration of a display panel cell, cover shield, and backlight, according to some embodiments of the disclosure.

A display assembly 300, shown in FIG. 3 may include a cover shield 302, a display panel cell 304, and a backlight 306. The cover shield 302 may protect the panel 304. The panel 304 may include a plurality of pixels for display of information to a user. The backlight 306 may illuminate the panel 304.

Figure 4:
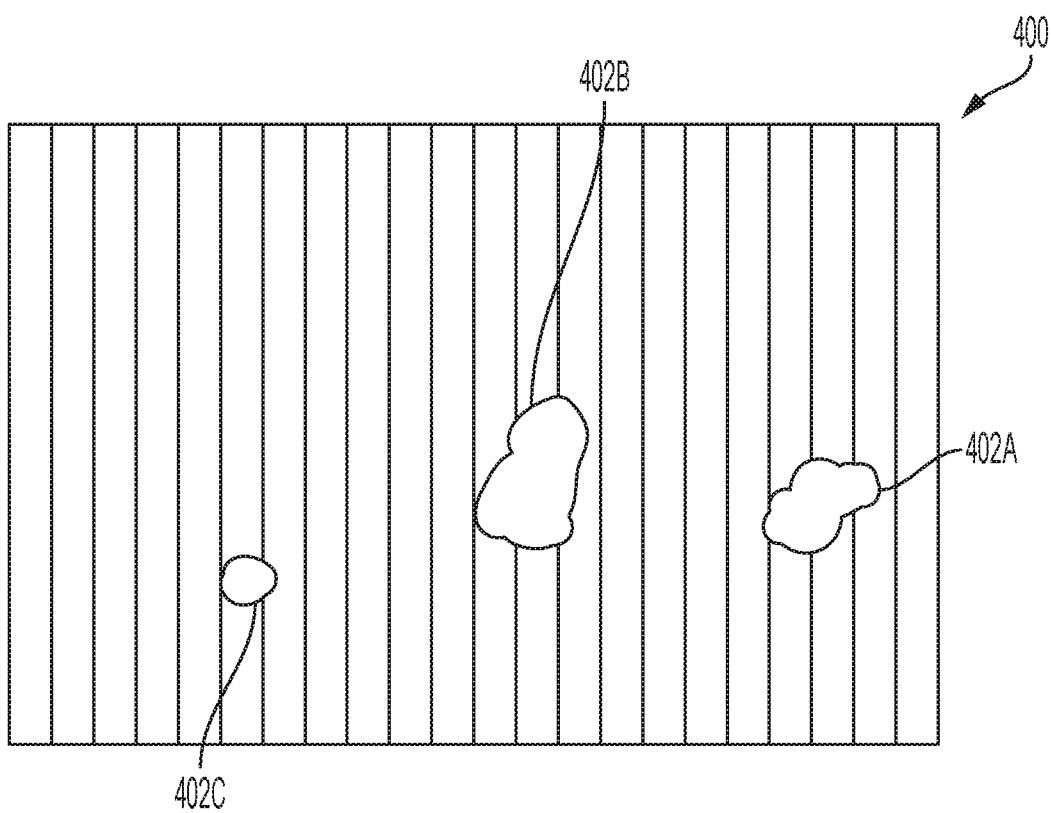
FIG. 4 is an illustration of a damaged COF according to some embodiments of the disclosure.

An example, COF 400 showing particle damage is shown in FIG. 4. The COF 400 may include a plurality of traces, such as copper traces. Particles that become trapped between the COF and a component of a display, such as a display mold frame, may cause damage 402A-C. For example, particles may cause corrosion, distortion, denting, and other damage to COF components, such as traces. Such damage may impede transfer of information from a display PCB to a display panel cell. For example, damage to the traces of a display COF 400 may cause display abnormalities, such as vertical lines of dead or discolored pixels.

Figure 5A:
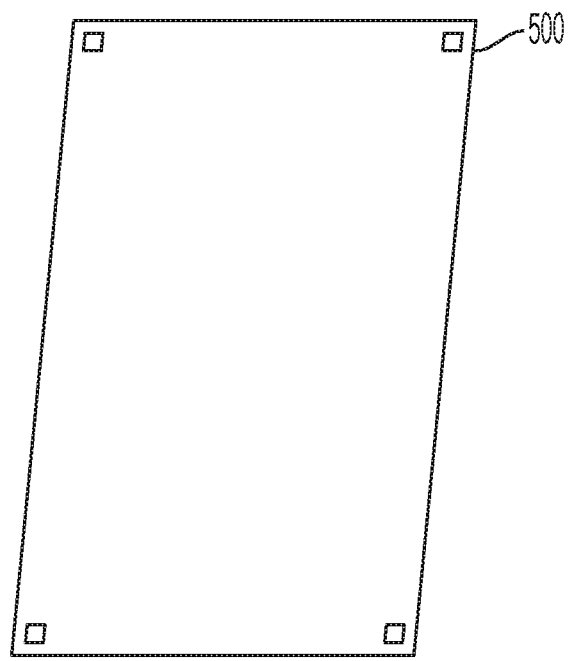
FIG. 5A is an illustration of a COF without protrusions according to some embodiments of the disclosure.
Figure 5B:
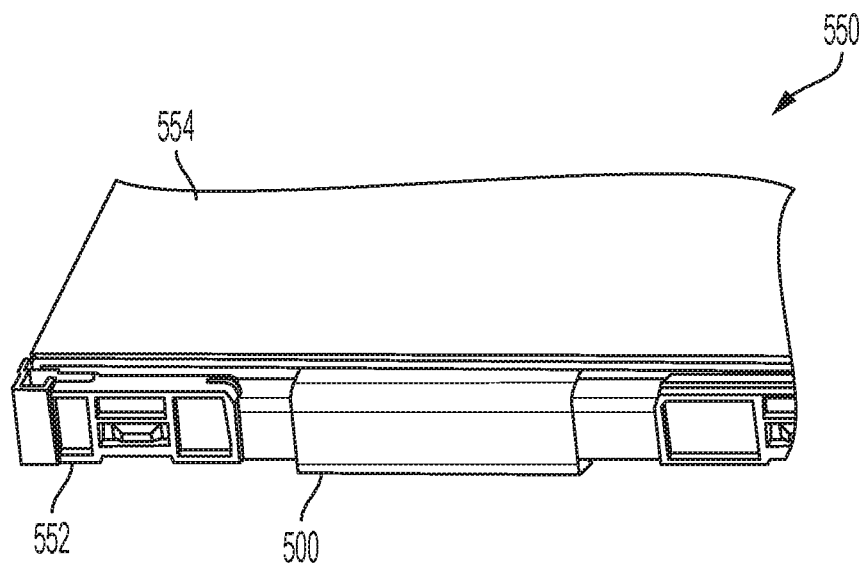
FIG. 5B is a perspective view of a portion of a display including a COF that is not embossed according to some embodiments of the disclosure.

An example COF 500 is shown in FIG. 5A. As shown in FIG. 5A, the COF may be a rectangular flat sheet, with a level surface. The COF 500 may be made of a flexible material and may have a length greater than its width. The COF 500 may wrap around at least a portion of a display mold frame 552, as shown in the perspective view 550 of FIG. 5B. The COF 500 may connect to a display panel cell 554. The portions of the COF 500 that are adjacent to the display mold frame 552 may come in contact with the display mold frame 552. For example, a continuous portion of the COF 500 across an entire width of a surface of the COF 500 may be in contact with the display mold frame 552, such as in contact with a corner of the display mold frame 552.

Figure 6A:
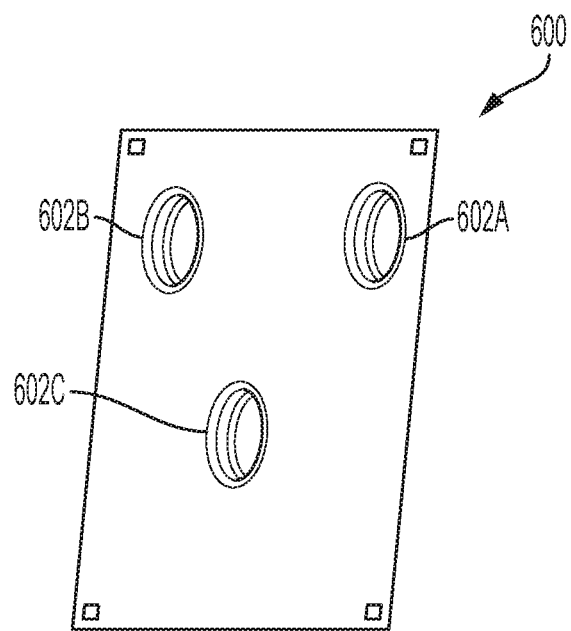
FIG. 6A is an illustration of a COF having a plurality of protrusions according to some embodiments of the disclosure.

A COF may be formed such that only a portion of an area of the COF adjacent to a mold frame of a display is in contact with the mold frame. For example, a COF may be embossed or patterned with one or more areas raised above a surface of the COF to contact the mold frame. An example patterned COF 600 is shown in FIG. 6A. As shown in FIG. 6A, the COF 600 includes three protrusions 602A-C that extend above a surface of the COF 600. The illustration of COF 600 shows a surface of the COF opposite the surface containing the protrusions having corresponding impressions 602A-C. The patterned COF 600 may include a single protrusion, two protrusions, or more protrusions. In some embodiments, the protrusions 602A-C may be positioned to raise a portion of the COF 600 adjacent to the protrusions across a width of the COF 600 from a mold frame of a display such that the protrusions are in contact with the mold frame but the remainder of the COF 600 is not in contact with the COF. The protrusions 602A-C may, for example, be embossed protrusions. The protrusions 602A-C may comprise less than one percent of a surface area of the COF 600.

Figure 6B:
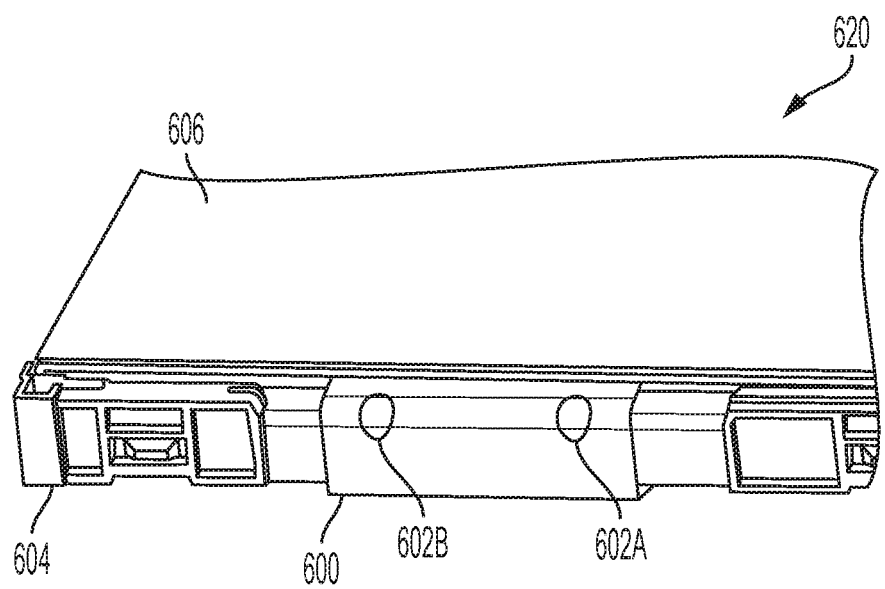
FIG. 6B is a perspective view of a portion of a display including a COF having a plurality of protrusions according to some embodiments of the disclosure.

In some embodiments, the protrusions 602A-C may comprise less than one percent of a portion of the surface area of the COF 600 that would be in contact with a mold frame if the protrusions were not present on the COF. In some embodiments, the protrusions 602A-C may be raised between less than 0.2 and greater than 0.4 mm from a remainder of the surface of the COF 600. In some embodiments, protrusions of a display COF 600 may be arranged in an asymmetrical pattern, such as a staggered pattern. Thus, in some embodiments, protrusions may not be located side by side on the COF 600 but rather in different locations along a length of the COF 600, such as illustrated by protrusion 602C. Thus, the protrusions 602A-C may contact a mold frame while maintaining a distance between the remainder of the COF 600 and the mold frame. For example, as shown in the perspective view 620 of a portion of a display in FIG. 6B, the protrusions 602A-B may raise the remainder of the COF 600, including one or more portions of the COF 600 located to either side of the COF 600 across a width of the COF 600 away from the mold frame 604. The lack of contact between portions of the COF 600 and the mold frame 604 may allow particles to pass freely between the two and may prevent particles from getting stuck. The flexibility of the display COF 600 may allow the impressions to be resilient even when subjected to continuous contact against the display mold frame allowing for a variety of different degrees of contact between the display COF 600 and the mold frame 604. Thus, the COF 600 may transmit data from a PCB to the display panel cell 606 without distortions caused by particles trapped between the COF 600 and the mold frame 604.

Figure 7:
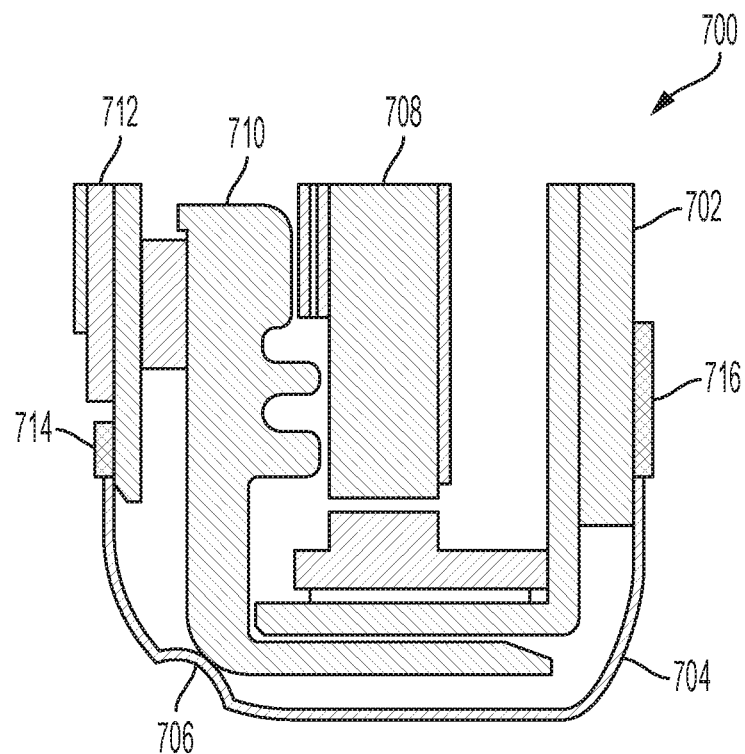
FIG. 7 is an illustration of a vertical cross section of a display including an embossed COF according to some embodiments of the disclosure.

FIG. 7 shows a vertical cross section of a display 700 where an embossed display COF 704 connects a display PCB 702 to a display panel cell 712. As shown in FIG. 7, a protrusion 706 of the display COF 704 may contact the mold frame 710. The protrusion 706 may raise a remainder of the display COF 704 away from the mold frame 710. As discussed earlier, a backlight 708 may illuminate the display panel cell 712. A first connector 714 of the COF 704 may couple to the display panel 712, and a second connector 716 of the COF 704 may couple to the display PCB 702.

Figure 8A:
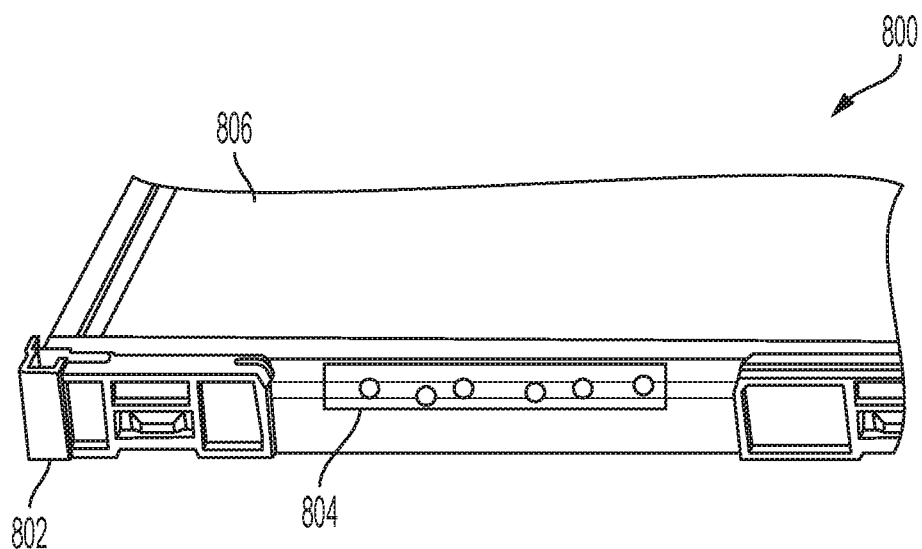
FIG. 8A is an illustration of a perspective view of a portion of a display including an embossed mold frame according to some embodiments of the disclosure.
Figure 8B:
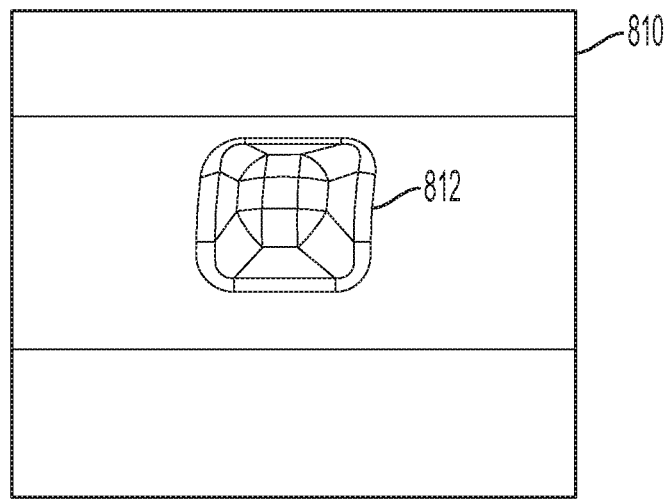
FIG. 8B is an illustration of a perspective view of an embossed protrusion on a mold frame according to some embodiments of the disclosure.
Figure 8C:
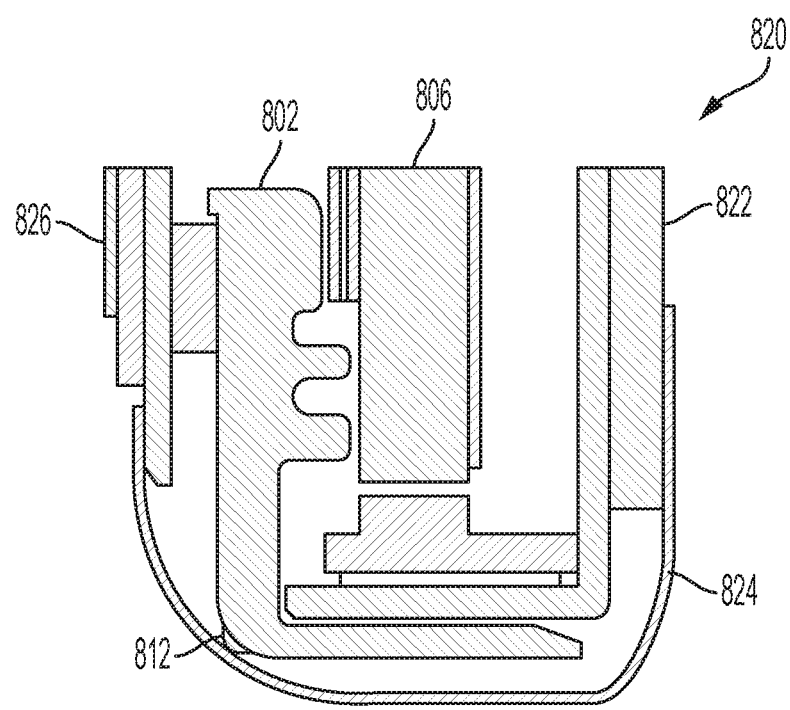
FIG. 8C is an illustration of a vertical cross section of a display including an embossed mold frame according to some embodiments of the disclosure.

In some embodiments, a mold frame of a display may be patterned to raise at least a portion of the COF away from the mold frame. For example, as shown perspective view 800 of a display in FIG. 8A, a mold frame 802 may include one or more protrusions 804 or other embossed patterns to raise at least a portion of a COF away from the mold frame. Thus, a COF may contact the protrusions 804 but not the remainder of the mold frame 802 to alleviate issues with trapped particles which may cause display abnormalities in display 806. The protrusions 804 may be positioned in a staggered formation. The protrusions may, for example, be dome-shaped, as shown in FIG. 8B. For example, a mold frame subsection 810 may include a dome-shaped protrusion 812. Protrusions may also be a variety of other shapes, such as sphere, rectangle, pyramid, and cylindrical shaped. The protrusion 812 may, for example, be a glossy protrusion and may have a smooth surface to prevent the protrusion from scratching or damaging the COF. In some embodiments, the protrusions 812 may be raised between less than 0.2 and greater than 0.4 mm from a surface of the mold frame 802. FIG. 8C shows a vertical cross section of a display 820 with a COF 824 connecting a PCB 822 to a display panel cell 826. A backlight 806 may illuminate the display panel cell. As shown in FIG. 8C, the mold frame 802 may include a protrusion 812 in contact with the COF 812, while a distance is maintained between the protrusion 812 and the remainder of the COF. Thus, particles may be allowed to pass freely between the display COF 824 and the mold frame 802 due to the protrusion 812 contacting the display COF 824 and maintaining a distance between the remaining area of the display COF 824 and the mold frame 802.

Figure 9:
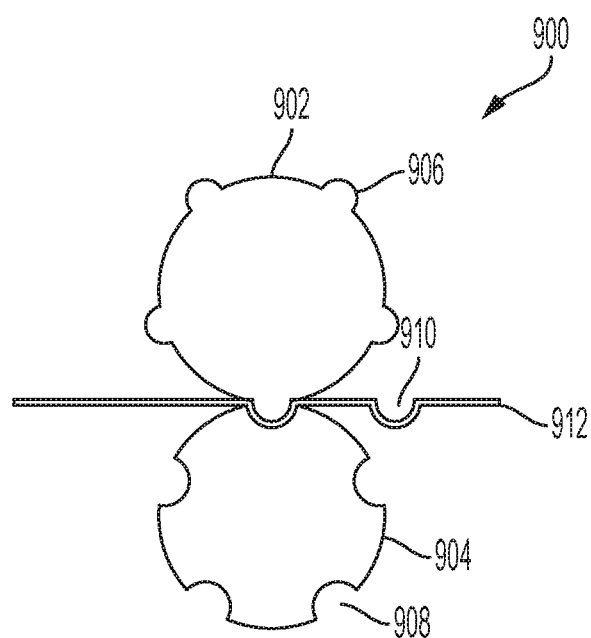
FIG. 9 is an illustration of an example system for imprinting a display COF according to some embodiments of the disclosure.

A plurality of rollers may be used to pattern a display COF with one or more protrusions, such as by embossing the display COF. FIG. 9 is an illustration of a system 900 for patterning a display COF 912. The system 900 may include a plurality of rollers. For example, a first roller 902 may include one or more protrusions 906 for creating protrusions, such as embossed impressions 910 in a display COF 912. A second roller 904 may include one or more depressions 908 for creating protrusions, such as embossed impressions 910, in a display COF 912. The first roller 902 and the second roller 904 may be heated rollers. In some embodiments, the protrusions 906 of the first roller 902 may be aligned with the depressions 908 of the second roller 904 to create the embossed impressions 910. In some embodiments, the protrusions 906 of the first roller 902 and the depressions 908 of the second roller 904 may be aligned in an asymmetrical pattern to create an asymmetrical pattern of embossed impressions 910 in the display COF 912. In some embodiments more than two rollers may be used to create a pattern in the display COF 912.

An example method 1000 for patterning a display COF may begin at step 1002 with forming of traces on a COF. For example, communication traces for allowing a display PCB to control a display panel cell may be printed on the COF. In some embodiments, other methods of fabrication may be used to generate traces on the COF. At step 1004, the display COF may be passed through a plurality of rollers to pattern the COF. The plurality of rollers may, for example, be heated rollers. In some embodiments, a first roller may include one or more convex protrusions from the roller to pattern the COF, such as by embossing the COF. A second roller may include one or more concave depressions in the roller to pattern the COF, such as by embossing the COF. In some embodiments, the protrusions of the first roller may align with the depressions in the second roller. In some embodiments, the protrusions of the first roller and the depressions of the second roller may be aligned to generate an asymmetrical pattern of impressions in the COF. An impression in the COF may, for example include a protrusion from a first surface of the COF and a corresponding depression in an opposite second surface of the COF. In some embodiments, traces may be printed on the COF after patterning the COF. In some embodiments, the traces on the COF may be aligned to avoid distortion of the traces by the plurality of rollers in generating one or more impressions in the display COF. The one or more impressions in the COF generated by the first and second rollers may, for example, include protrusions from the COF, such that a first portion of the COF comprising the one or more protrusions extends outward from the remainder of the surface of the COF. The protrusions may, for example, be dome shaped, pyramid shaped, cylindrical, or may have a different shape. Thus, rollers may be used to generate impressions in a COF such that the impressions of the COF may contact a mold frame of a display while maintaining a distance between the remainder of the COF and the mold frame of the display to allow particles to pass freely between the mold frame and the display COF.

Figure 10:
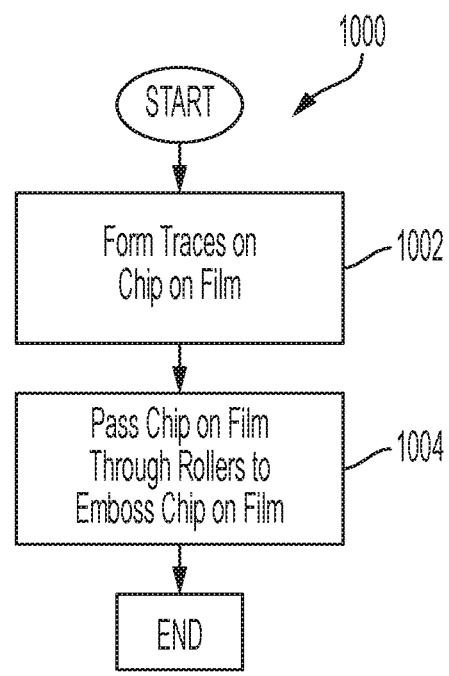
FIG. 10 is a flow chart of an example method for embossing a COF according to some embodiments of the disclosure.

The flow chart diagrams of FIG. 10 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A display for an information handling system, the display comprising:
    a display panel cell;
    a mold frame; and
    a chip-on-film coupled to the display panel cell,
    wherein the chip-on-film comprises one or more protrusions in contact with the mold frame,
    wherein the one or more protrusions comprise a plurality of imprinted embossed impressions, and
    wherein the one or more protrusions comprise less than one percent of a surface area of the chip-on-film, wherein a first portion of the chip-on-film is adjacent to the one or more protrusions across a width of a first surface of the chip-on-film, and wherein the first portion of the chip-on-film adjacent to the one or more protrusions is not in contact with the mold frame.

2. The display of claim 1, wherein the plurality of imprinted embossed impressions comprise convex imprinted embossed impressions, and wherein an apex of one or more of the convex imprinted embossed impressions is in contact with the mold frame.

3. The display of claim 1, wherein the plurality of imprinted embossed impressions is asymmetrical.

4. The display of claim 1, wherein the chip-on-film further comprises a plurality of traces, and wherein the plurality of traces are positioned to avoid distortion of one or more of the plurality of traces by the one or more protrusions.

5. The display of claim 1, further comprising:
    a display printed circuit board (PCB),
    wherein the chip-on-film is further coupled to the display PCB.

6. The display of claim 1, further comprising:
    a decorative casing,
    wherein at least part of a first surface of the chip-on-film is in contact with the decorative casing.

7. The display of claim 1, wherein the one or more protrusions are positioned to allow particles to move freely between the chip-on-film and the mold frame.

8. A chip-on-film for a display, the chip-on-film comprising:
    a first connector for coupling to a display panel cell;
    a second connector for coupling to a display printed circuit board (PCB); and
    one or more protrusions in contact with a mold frame of the display,
    wherein a first portion of the chip-on-film is adjacent to the one or more protrusions across a width of a first surface of the chip-on-film,
    wherein the one or more protrusions are in contact with a mold frame and the first portion of the chip-on-film adjacent to the one or more protrusions is not in contact with the mold frame,
    wherein the one or more protrusions comprise a plurality of imprinted embossed impressions, and
    wherein the one or more protrusions comprise less than one percent of a surface area of the chip-on-film, wherein a first portion of the chip-on-film is adjacent to the one or more protrusions across a width of a first surface of the chip-on-film, and wherein the first portion of the chip-on-film adjacent to the one or more protrusions is not in contact with the mold frame.

9. The chip-on-film of claim 8, wherein the plurality of imprinted embossed impressions comprise convex imprinted embossed impressions, and wherein an apex of one or more of the convex imprinted embossed impressions is in contact with the mold frame.

10. The chip-on-film of claim 8, wherein the plurality of imprinted embossed impressions is asymmetrical.

11. The chip-on-film of claim 8, wherein the chip-on-film further comprises a plurality of traces, and wherein the plurality of traces are positioned to avoid distortion of one or more of the plurality of traces by the one or more protrusions.

12. The chip-on-film of claim 8, wherein at least part of a surface of the chip-on-film is in contact with a decorative casing.

* * * * *